(12) United States Patent
Mackey et al.

(10) Patent No.: US 10,779,077 B2
(45) Date of Patent: Sep. 15, 2020

(54) MICROPHONE CAVITY

(71) Applicant: Bose Corporation, Framingham, MA (US)

(72) Inventors: Austin Mackey, Brighton, MA (US); Brandon Hicks, Ludlow, MA (US); Donna Marie Sullivan, Millbury, MA (US); Christopher Ratcliffe, Mendon, MA (US)

(73) Assignee: BOSE CORPORATION, Framingham, MA (US)

( * ) Notice: Subject to any disclaimer, the term of this patent is extended or adjusted under 35 U.S.C. 154(b) by 0 days.

(21) Appl. No.: 16/558,254

(22) Filed: Sep. 2, 2019

(65) Prior Publication Data

US 2019/0387309 A1  Dec. 19, 2019

Related U.S. Application Data

(63) Continuation of application No. 15/804,662, filed on Nov. 6, 2017, now Pat. No. 10,405,086.

(51) Int. Cl.
| | |
|---|---|
| *H04R 1/28* | (2006.01) |
| *H04R 1/08* | (2006.01) |
| *H04R 1/40* | (2006.01) |
| *H04R 31/00* | (2006.01) |
| *H05K 1/18* | (2006.01) |

(52) U.S. Cl.
CPC ........... *H04R 1/2884* (2013.01); *H04R 1/086* (2013.01); *H04R 1/406* (2013.01); *H04R 31/006* (2013.01); *H05K 1/18* (2013.01); *H04R 2201/029* (2013.01); *H04R 2410/07* (2013.01); *H05K 2201/10083* (2013.01)

(58) Field of Classification Search
CPC .. H04R 1/2884; H04R 1/2869; H04R 1/2892; H04R 1/406; H04R 1/30; H04R 2499/11; G10K 11/08; G10K 11/22; G10K 11/02
See application file for complete search history.

(56) References Cited

U.S. PATENT DOCUMENTS

| | | | | |
|---|---|---|---|---|
| 5,282,245 A | * | 1/1994 | Anderson | ............... H04M 1/19 |
| | | | | 379/433.03 |
| 2017/0111720 A1 | * | 4/2017 | Miehl | .................... H04R 1/406 |

* cited by examiner

*Primary Examiner* — Sunita Joshi (57) ABSTRACT

An apparatus includes a printed wiring board (PWB) that defines an aperture. A microphone is mounted on the PWB such that the aperture provides an acoustic path to the microphone. An acoustic interface member defines a cavity that is acoustically coupled to the microphone via the aperture. A first gasket between the printed wiring board and the acoustic interface member forms an acoustic seal. A housing is included, and a second gasket is disposed between the acoustic interface member and the housing to form an acoustic seal. An acoustic chamber is defined by a sealed volume that extends from a first (bottom/inner) surface of the housing down to a junction between the microphone and the PWB. The housing defines apertures which provide an acoustic path between a region external to the housing and the acoustic chamber. The acoustic chamber and the apertures in the housing form a Helmholtz resonator.

20 Claims, 9 Drawing Sheets

MICROPHONE CAVITY

RELATED APPLICATIONS

This application is a continuation application and claims benefit of U.S. patent application Ser. No. 15/804,662 filed Nov. 6, 2017, titled "Microphone Cavity," the contents of which are incorporated by reference herein in their entirety.

BACKGROUND

This disclosure relates to a unique design for a microphone cavity, which can help to reduce wind noise and can assist in pushing resonant frequencies outside of a frequency band of interest (e.g., the voice/speech frequency band).

Figure 1:
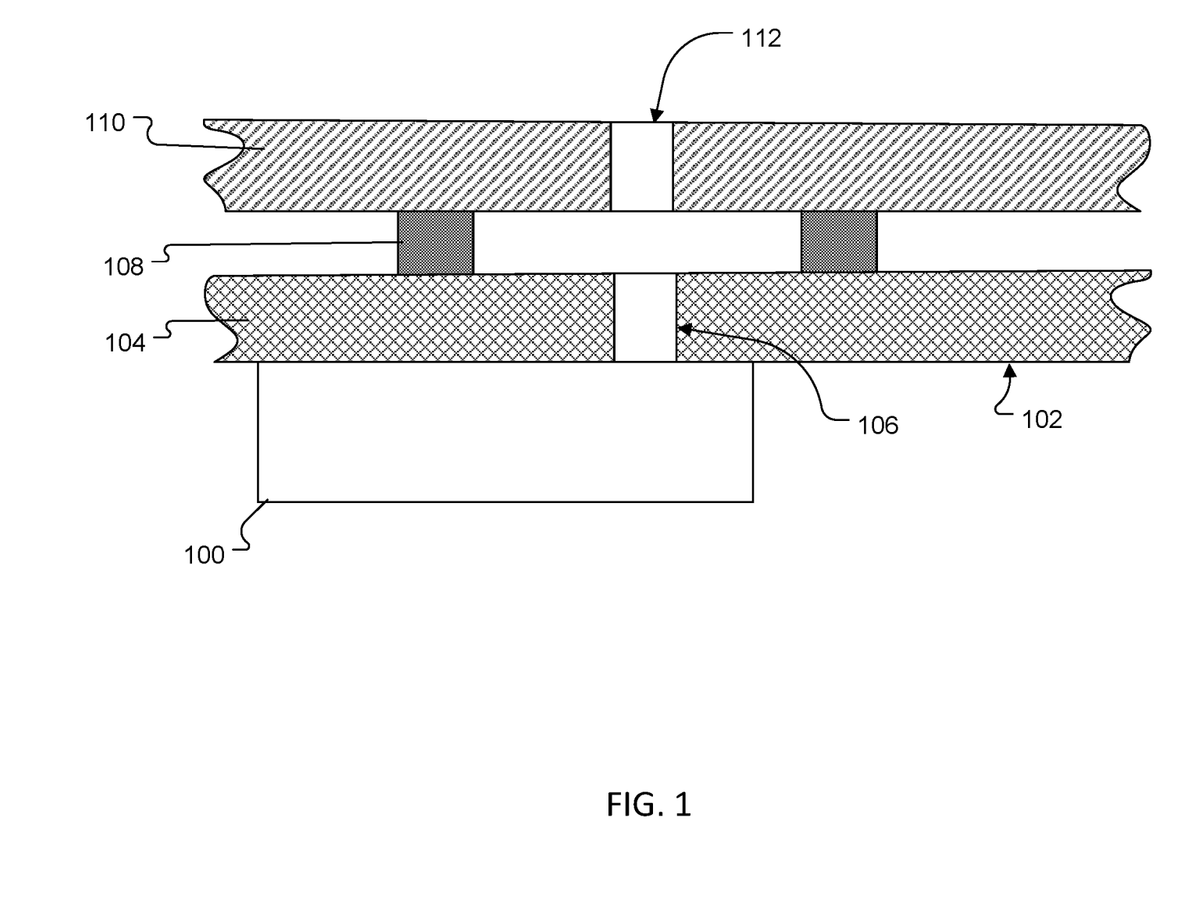
FIG. 1 is a cross-sectional view of a known mounting arrangement for a MEMS microphone.

FIG. 1 illustrates a known mounting arrangement for a microelectromechanical system (MEMS) microphone 100, as recommended by a manufacturer. The microphone 100 is mounted (surface mount soldered) to a bottom surface 102 of a printed wiring board (PWB) 104. An aperture 106 is provided in the PWB 104 to provide an acoustic path to the microphone 100. A gasket 108 is arranged between a top surface of the PWB 104 and a bottom surface of a product housing 110 to provide an acoustic seal therebetween. The housing 110 is typically a hard, plastic cover to the product incorporating the microphone. An aperture 112 is provided in the housing 110, and is aligned with the aperture 106 in the PWB 104, to extend the acoustic path to the microphone 100.

This configuration presents a couple of issues. First, with the alignment of the apertures in the PWB 104 and the housing 110, what results is essentially a single port. There is a resonance that can form owing to a pocket of air, which acts as a moving mass, that is trapped in that port. That can be undesirable, particularly if the resonance occurs in the frequencies of interest to the user. This can be particularly problematic in products that incorporate a microphone array since the resonance from each microphone in the array may be shifted either in phase or frequency, relative to the other microphones, due to manufacturing differences. That can result in a very complex resonance issue that can be difficult to predict.

The second issue that the arrangement of FIG. 1 presents relates to wind noise. Basically, what this relates to is the amount of surface area that is present along the surface at the opening to the opening to the microphone 100. Where the surface area is very small at the opening to the aperture 112 along the top (outer) surface of the housing 110, there will be higher turbulence, resulting from wind/air passing along the surface, at the opening, which will result is more wind noise. This problem can be exacerbated in products that incorporate a microphone array because there is a cumulative effect since the noise from each microphone in the array contributes to the total noise.

To address/prevent these issues manufacturers have defined very specific dimensional design constraints.

SUMMARY

All examples and features mentioned below can be combined in any technically possible way.

In one aspect, an apparatus includes a printed wiring board (PWB) that defines an aperture. A microphone is mounted on the PWB such that the aperture provides an acoustic path to the microphone. The apparatus also includes an acoustic interface member that defines a cavity that is acoustically coupled to the microphone via the aperture in the PWB. A first gasket is disposed between the printed wiring board and the acoustic interface member to form an acoustic seal therebetween. The apparatus includes a housing, and a second gasket is disposed between the acoustic interface member and the housing to form an acoustic seal therebetween. An acoustic chamber is defined by a sealed volume that extends from a first (bottom/inner) surface of the housing down to a junction between the microphone and the PWB. The housing defines one or more apertures which provide an acoustic path between a region external to the housing and the acoustic chamber. The acoustic chamber and the one or more apertures defined by the housing collectively form a Helmholtz resonator.

Implementations may include one of the following features, or any combination thereof.

In some implementations, the cavity includes one or more tapered walls which are arranged such that a cross-sectional area of the cavity is at a maximum at a first surface of the acoustic interface member. The first surface of the acoustic interface member faces the housing and a second, opposite surface of the acoustic interface member faces the PWB.

In certain implementations, the second gasket is molded directly on the first surface of the acoustic interface member.

In some cases, the acoustic interface member defines an aperture that provides an acoustic path between the cavity and the aperture defined by the PWB.

In certain cases, the cavity includes one or more tapered walls which are arranged such that a cross-sectional area of the cavity decreases from a maximum area at a first surface of the acoustic interface member to a minimum area at a junction with the aperture defined by the acoustic interface member.

In some examples, the one or more tapered walls are arranged in the shape of a truncated polygonal pyramid, a truncated circular cone, or a truncated elliptical cone.

In certain examples, the cavity is tapered such that a cross-sectional area of the cavity decreases from a maximum area at a first surface of the acoustic interface member to a minimum area at an opposite, second surface of the acoustic interface member. The first surface of the acoustic interface member faces the housing and the second surface of the acoustic interface member faces the PWB.

In some implementations, the Helmholtz resonator has a resonant frequency above 8 kHz.

In certain implementations, the housing defines a plurality apertures, and the acoustic chamber and the plurality of apertures defined by the housing collectively form the Helmholtz resonator.

In some cases, the acoustic interface member is formed of a molded plastic part, and the second gasket is formed of an elastomer that is bonded to the acoustic interface member in a two-shot molding process.

In another aspect, a loudspeaker includes a printed wiring board (PWB) that defines an aperture. A microphone is mounted on the PWB such that the aperture provides an acoustic path to the microphone. The loudspeaker also includes an acoustic interface member that defines a cavity that is acoustically coupled to the microphone via the aperture in the PWB. A first gasket is disposed between the printed wiring board and the acoustic interface member to form an acoustic seal therebetween. The loudspeaker also includes a housing, and a second gasket is disposed between the acoustic interface member and the housing to form an acoustic seal therebetween. An acoustic chamber is defined by a sealed volume that extends from a first (bottom/inner) surface of the housing down to a junction between the microphone and the PWB. The housing defines one or more apertures which provide an acoustic path between a region external to the housing and the acoustic chamber. The acoustic chamber and the one or more apertures defined by the housing collectively form a Helmholtz resonator. An acoustic assembly is disposed within the housing. The acoustic assembly includes one or more electro-acoustic transducers for transducing an electrical signal to acoustic energy.

Implementations may include one of the above and/or below features, or any combination thereof.

According to another aspect, an apparatus includes a printed wiring board (PWB) that defines a plurality of apertures. A plurality of microphones are mounted on the PWB such that each of the apertures defined by the PWB provides an acoustic path to one of the microphones. An acoustic interface member defines a plurality of cavities each of which is acoustically coupled to one of the plurality of microphones via one of the apertures defined by the PWB. A plurality of first acoustic seals are provided between the PWB and the acoustic interface member. Each of the first acoustic seals surrounds one of the apertures defined by the PWB. The apparatus includes a housing, and a plurality of second acoustic seals are provided between the acoustic interface member and the housing. Each of the second acoustic seals surrounds one of the cavities. The housing, the second acoustic seals, and the cavities collectively define a plurality of acoustic chambers. The housing defines a plurality of apertures which provide acoustic paths between a region external to the housing and the acoustic chambers. The acoustic chambers and the apertures defined by the housing collectively form a plurality of Helmholtz resonators.

Implementations may include one of the above and/or below features, or any combination thereof.

In some implementations, each of the cavities includes one or more tapered walls which are arranged such that a cross-sectional area of the cavity is at a maximum at a first surface of the acoustic interface member. The first surface of the acoustic interface member faces the housing and a second, opposite surface of the acoustic interface member faces the PWB.

In certain implementations, the acoustic interface member defines a plurality of apertures each of which provides an acoustic path between the acoustic cavity and one of the apertures defined by the PWB.

In some cases, each of the cavities includes one or more tapered walls which are arranged such that a cross-sectional area of the cavity decreases from a maximum area at a first surface of the acoustic interface member to a minimum area at a junction with a corresponding one of the apertures defined by the acoustic interface member.

In certain cases, each of the cavities includes one or more tapered walls which are arranged in the shape of a truncated polygonal pyramid, a truncated circular cone, or a truncated elliptical cone.

In some examples. each of the cavities is tapered such that a cross-sectional area of the cavity decreases from a maximum area at a first surface of the acoustic interface member to a minimum area at an opposite, second surface of the acoustic interface member, and the first surface of the acoustic interface member faces the housing and the second surface of the acoustic interface member faces the PWB.

In certain examples, each of the Helmholtz resonators has a resonant frequency above 8 kHz.

In some implementations, a plurality of the apertures defined by the housing overlie each of the acoustic chambers such that each of the Helmholtz resonators is formed of one of the chambers and a plurality of the apertures defined by the housing.

In yet another aspect, a loudspeaker includes a printed wiring board (PWB) that defines a plurality of apertures. A plurality of microphones are mounted on the PWB such that each of the apertures defined by the PWB provides an acoustic path to one of the microphones. An acoustic interface member defines a plurality of cavities each of which is acoustically coupled to one of the plurality of microphones via one of the apertures defined by the PWB. A plurality of first acoustic seals are provided between the PWB and the acoustic interface member. Each of the first acoustic seals surrounds one of the apertures defined by the PWB. A plurality of second acoustic seals are provided between the acoustic interface member and the housing. Each of the second acoustic seals surrounds one of the cavities. The housing, the second acoustic seals, and the cavities collectively define a plurality of acoustic chambers. The housing defines a plurality of apertures which provide acoustic paths between a region external to the housing and the acoustic chambers. The acoustic chambers and the apertures defined by the housing collectively form a plurality of Helmholtz resonators. An acoustic assembly is disposed within the housing. The acoustic assembly includes one or more electro-acoustic transducers for transducing an electrical signal to acoustic energy.

Implementations may include one of the above features, or any combination thereof.

DETAILED DESCRIPTION

Figure 2:
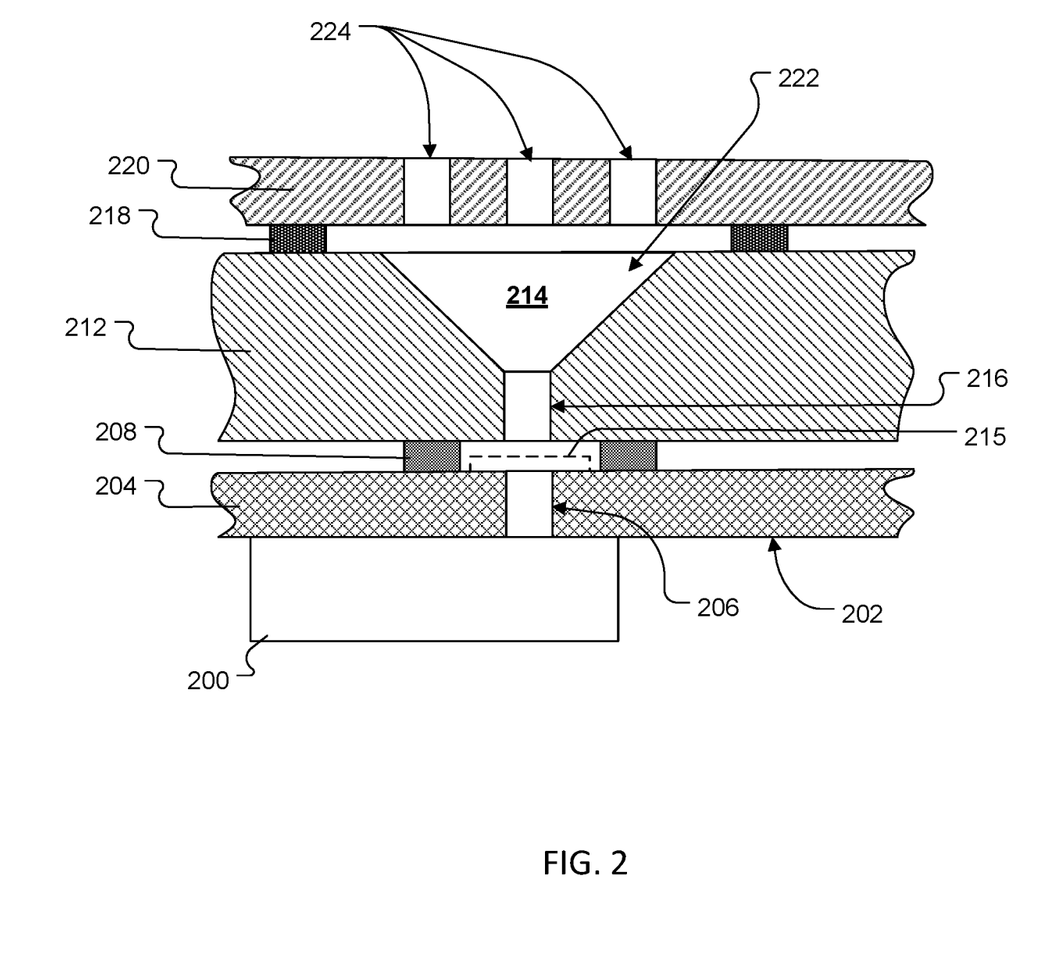
FIG. 2 is a cross-sectional view of a first implementation of a microphone mounting arrangement in accordance with this disclosure.

FIG. 2 illustrates a design for a microphone mounting arrangement, which addresses the issues discussed above. As shown in FIG. 2, the arrangement includes a MEMS microphone 200 that is mounted to a bottom surface 202 of a printed wiring board (PWB) 204. The PWB 204 includes an aperture 206 to allow for an acoustic path to the microphone 200. A first gasket 208 is disposed between a top surface 210 of the PWB 204 and a bottom surface of an acoustic interface member 212.

The acoustic interface member 212 defines a cavity 214, which extends from a top surface of the acoustic interface member 212 to a first open end of an aperture 216. The aperture 216 is formed in the acoustic interface member 212 and is aligned with the aperture 206 in the PWB 204 to provide an acoustic pathway between the cavity 214 to the microphone 200. In some cases, an acoustically transparent screen material 215 may be disposed along the top surface of the PWB 204 covering the open end of the microphone aperture 206 to help prevent dust and debris from getting into the microphone aperture 206.

The cavity 214 is tapered such that the cross-sectional area of the cavity 214 decreases from a maximum area at the top surface of the acoustic interface member 212 to a minimum area at the junction with the aperture 216. A second gasket 218 is disposed between the top surface of the acoustic interface member 212 and a bottom surface of a housing 220 to provide an acoustic seal therebetween. an acoustic chamber 222 is defined by the sealed volume (i.e., as sealed by gaskets 208 & 218) from the bottom surface of the housing 220 down to the junction between the microphone 200 and the bottom surface 202 of the PWB 204, including the cavity 214, the aperture 216, and the microphone aperture 206. The housing 220 defines a plurality of apertures 224 (3 shown), which provide and acoustic path between the region external to the housing 220 and the acoustic chamber 222. The acoustic chamber 222, and the apertures 224 collectively form a Helmholtz resonator. In that regard, each aperture 224 is its own port. So the result of this configuration is several ports in parallel. Those ports are coupled with the mic cavity 214, which acts as a compliant element. The resonance comes from the parallel ports and the compliance of the cavity volume.

Notably, the tapered shape of the cavity 214 has the effect of creating a relatively large surface area at the top surface of the interface member 212; large enough to cover the span of three of the apertures 224 in the housing. This relatively large surface area can help to reduce the wind noise that is picked up by the microphone 200. At the same time, the tapering of the cavity 214 also enables the volume of the acoustic chamber 222 to be kept relatively small, which assists in pushing the resonance frequency of the Helmholtz resonator above the frequency band of interest (i.e., above the speech band). In that regard, the band of interest is about 200 Hz to about 8 kHz, and it can be desirable to push the resonant frequency of the Helmholtz resonator above 10 kHz. The tapered shape of the cavity 214 may correspond to a truncated polygonal pyramid (e.g., a truncated rectangular pyramid, or a truncated pentagonal pyramid), a truncated circular cone, or a truncated elliptical cone.

Figure 3A:
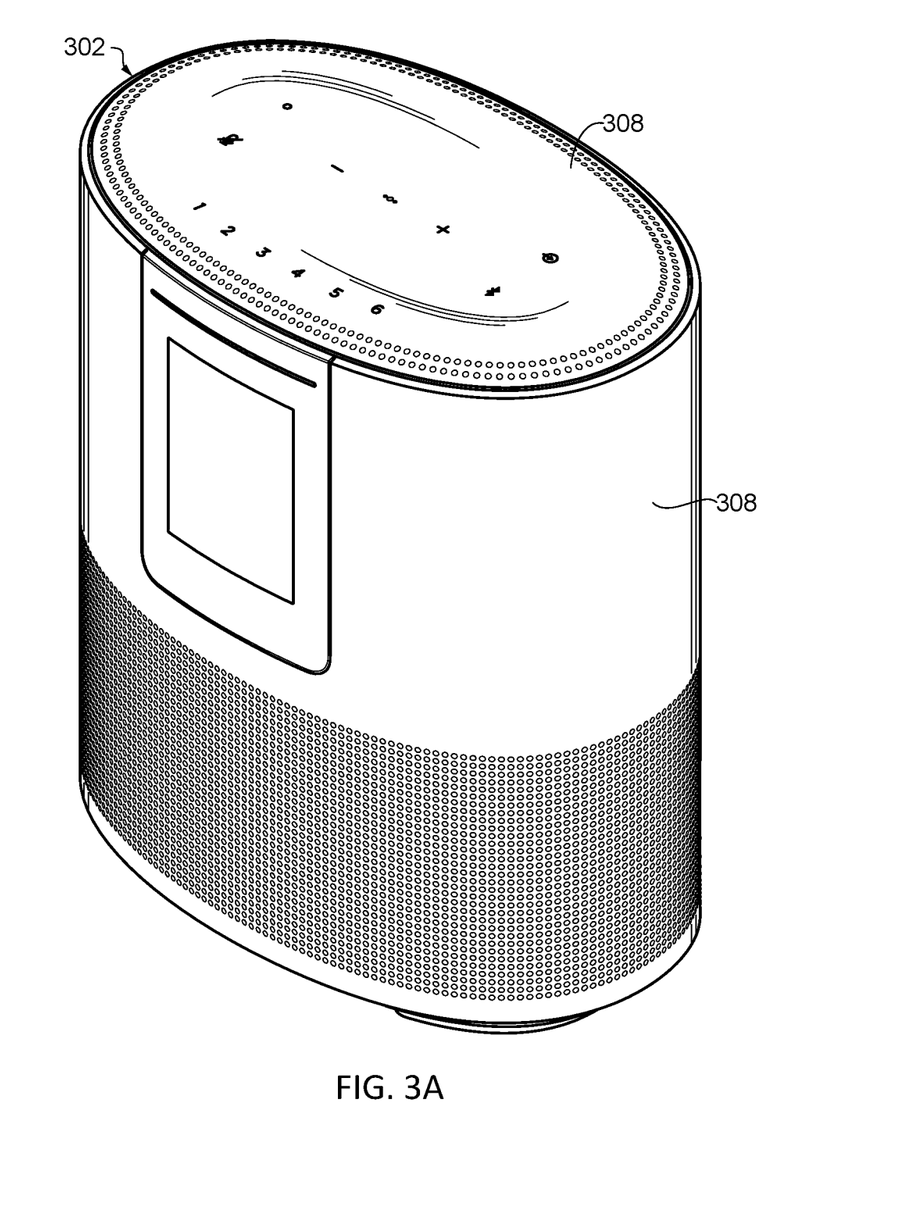
FIGS. 3A & 3B are perspective and cross-sectional views, respectively, of a loudspeaker.
Figure 3B:
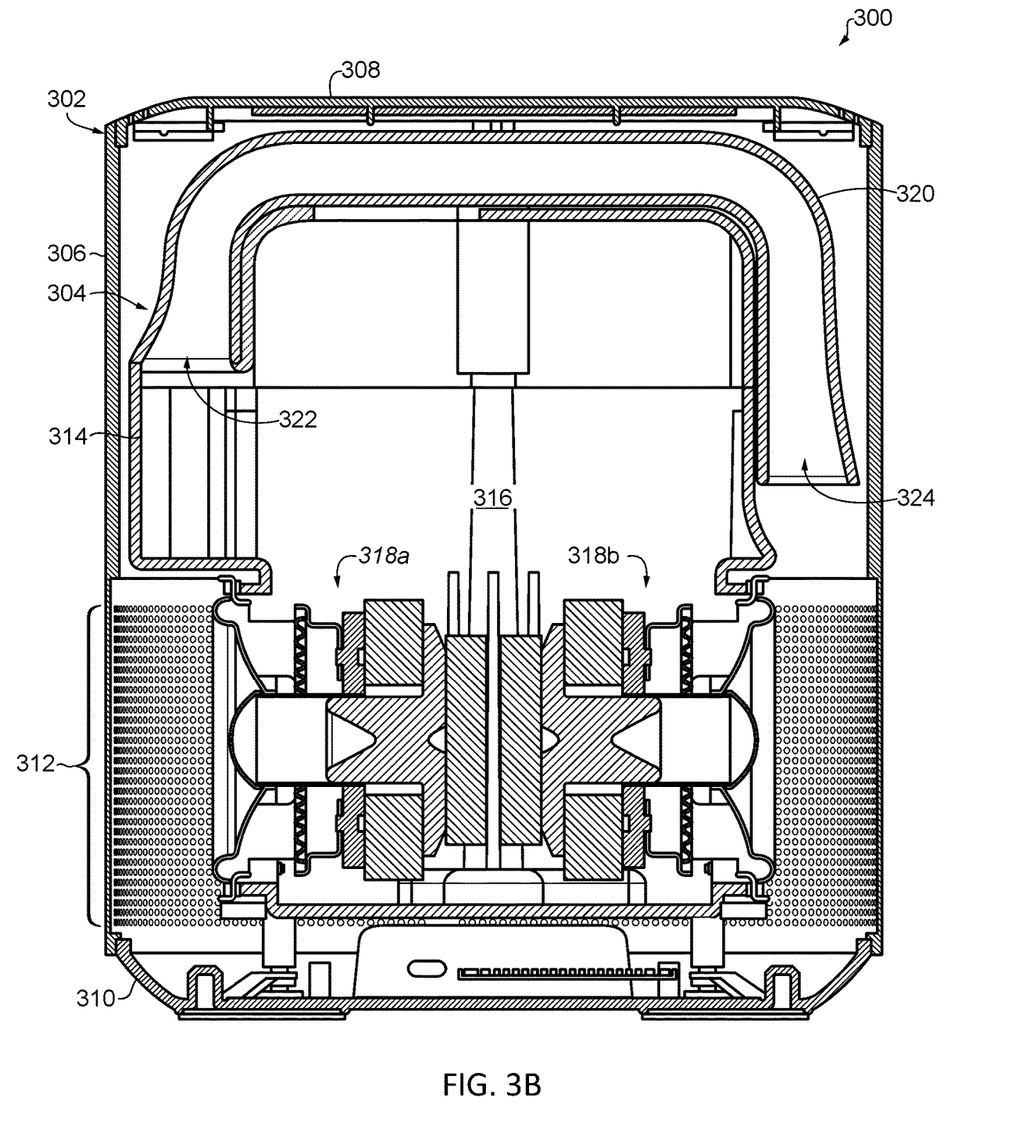

FIGS. 3A & 3B illustrate a loudspeaker 300 that incorporates a microphone mounting arrangement of the type described above with reference to FIG. 2. The loudspeaker 300 includes a housing 302 which encloses an acoustic assembly 304 (FIG. 3B). The housing 302 includes a hollow body 306, shown in the form of an ellipsoidal cylinder; a top cap 308, which closes off a first open end of the hollow body 306, and a bottom cap 310, which closes of a second open end of the hollow body 306. The hollow body 306 includes an acoustically transparent grille region 312 that consists essentially of a plurality of apertures that are formed in the hollow body 306 to permit acoustic energy that is radiated by the acoustic assembly 304 to escape from the interior of the housing 302.

The acoustic assembly 304 includes an acoustic enclosure 314, which defines a cavity 316. In the illustrated implementation, a pair of electro-acoustic transducers 318a, 318b are supported on the acoustic enclosure 314 and are arranged such that their respective rear radiating surfaces radiate acoustic energy into the cavity 316, and such that their respective front radiating surfaces radiate acoustic energy to a region external to the cavity 316. The electro-acoustic transducers 318a, 318b are driven with parallel and coaxial, directions of motion which are acoustically in phase with each other and mechanically out of phase with each other. Using two electro-acoustic transducers 318a, 318b within a single enclosure can be advantageous because the inertial forces associated with the transducers may be made to cancel each other to inhibit undesirable vibration or movement of the enclosure 314 resulting from the operation of the transducers.

In the illustrated implementation, the acoustic assembly 304 also includes a port 320. The port 320 extends from a first open end, which is acoustically coupled to the cavity 316, to a second open end, which is acoustic coupled to the region external to the cavity 316.

Figure 4A:
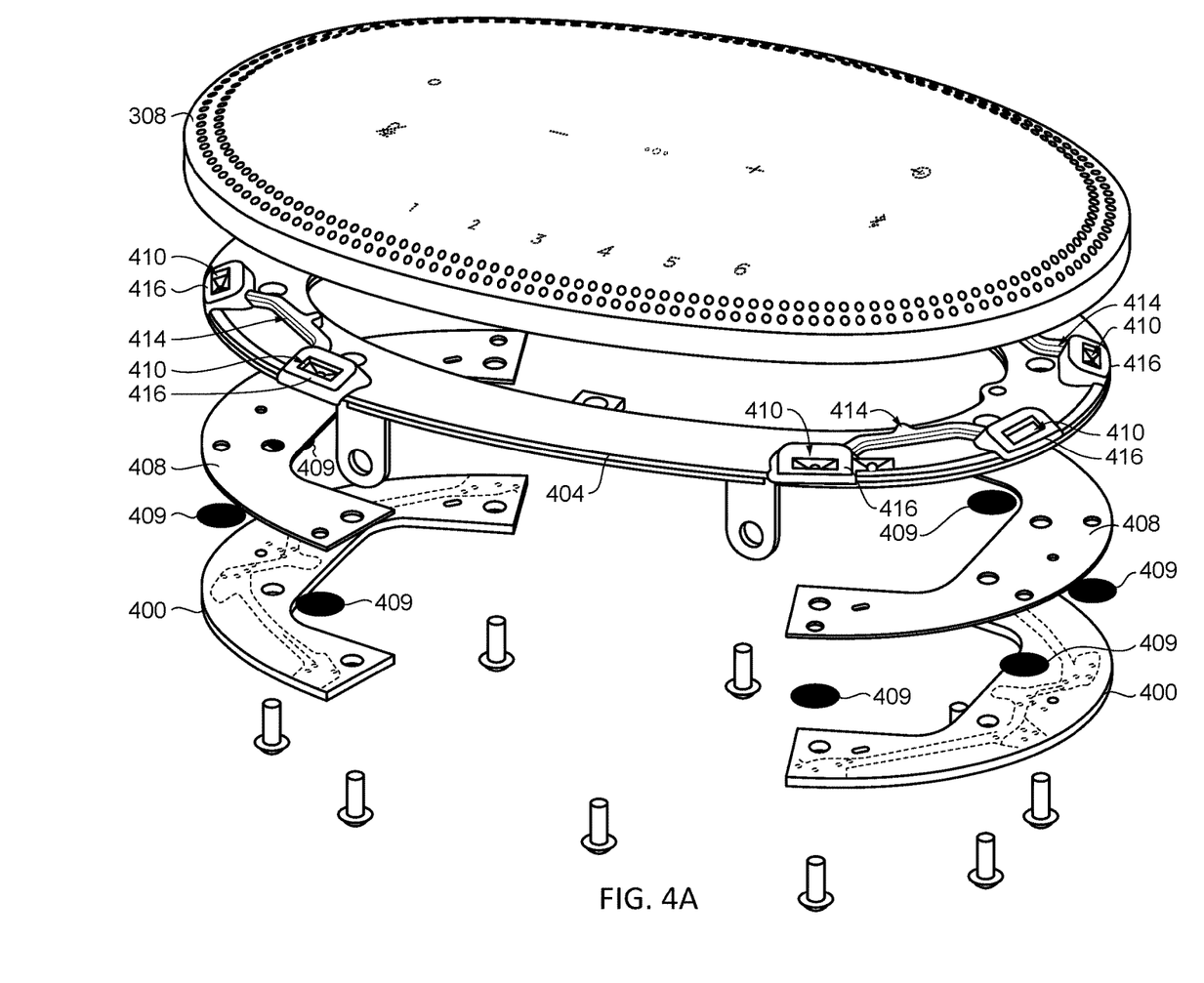
FIGS. 4A & 4B are exploded perspective views of a top cover and microphone assembly from the loudspeaker of FIG. 3A.
Figure 4B:
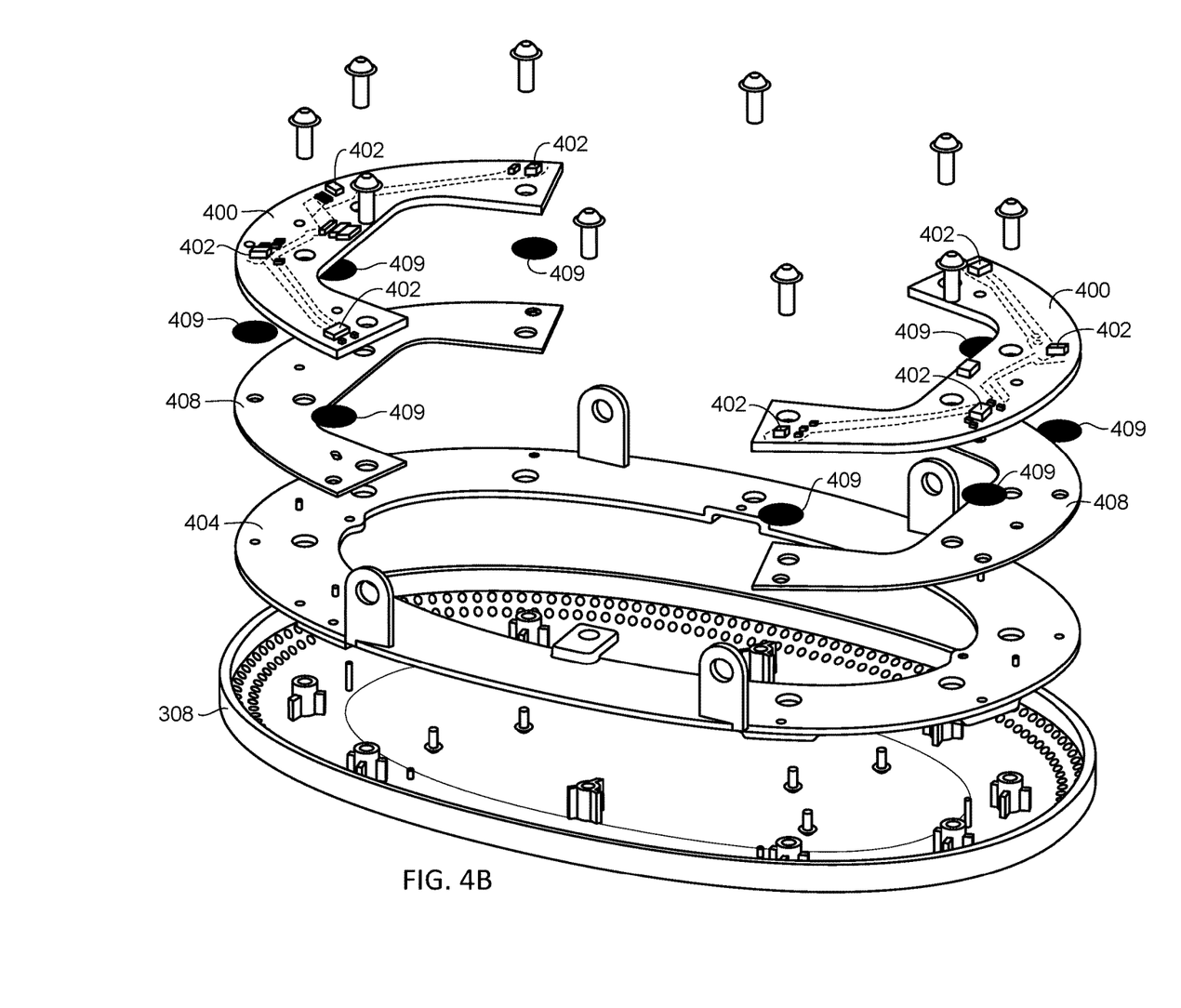
Figure 4C:
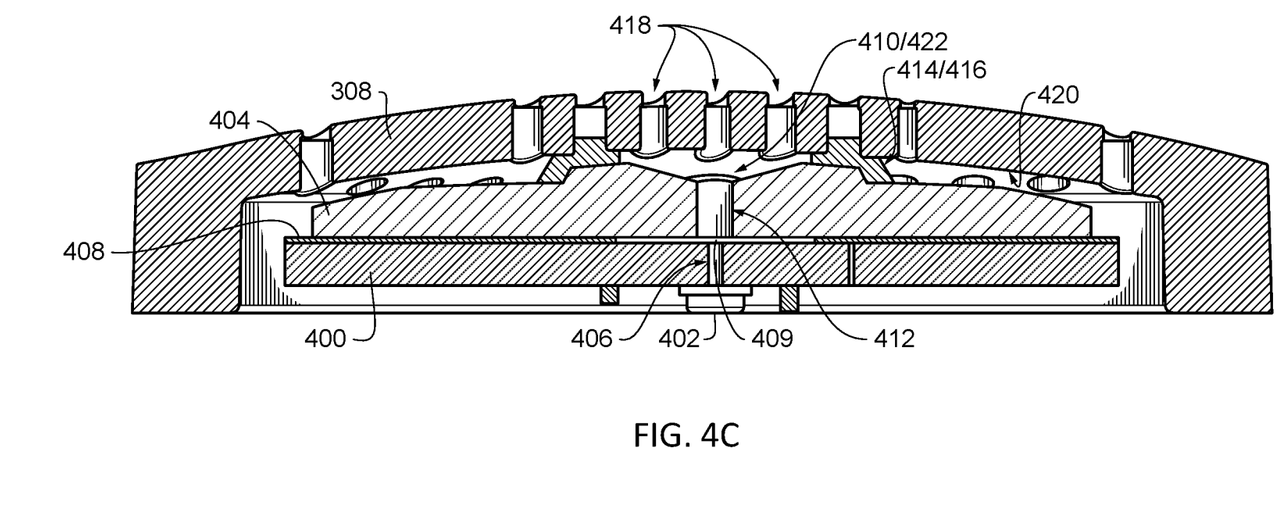
FIG. 4C is a cross-sectional view of a microphone mounting arrangement from the loudspeaker of FIG. 4A.

Referring to FIGS. 4A-4C, the loudspeaker 300 also includes a microphone mounting arrangement that includes a pair of printed wiring boards (PWBs) 400, each of which supports a plurality (e.g., 4) microphones 402 (e.g., bottom mounted MEMS microphones, as shown in FIG. 4C) on its bottom surface, and a ring-shaped acoustic interface member 404, which is disposed between the PWBs 400 and the top cap 308. The microphones 402 are arrayed and may make use of beam steering to focus sensitivity in the direction of a source of speech. Because of the arraying, i.e., because multiple microphone signals are being combined, this arrangement may be more susceptible to wind noise. That is, there is a cumulative effect since the noise from each microphone in the array contributes to the total noise.

Each of the microphones 402 is mounted to a bottom surface 400 of a corresponding one of the PWBs 400. Each of the PWBs 400 includes a plurality of microphone apertures 406 (one shown in FIG. 4C), each of which is arranged to provide an acoustic path to a corresponding one of the microphones 402. A first gasket 408 is provided in the region of each microphone location and is disposed between a top surface of the corresponding one of the PWBs 400 and a bottom surface of the acoustic interface member 404 to provide an acoustic seal therebetween. The first gaskets 408 may be formed of a compressible foam material, such as Poron® microcellular urethanes available from ROGERS Corporation of Chandler, Ariz., USA, and are typically compressed to form a tight acoustic seal when the associated PWB 400 is fastened (e.g., via screws) to the top cover 308.

In some cases, an acoustically transparent screen material 409 (a/k/a "screen") may be disposed along the respective top surfaces of the PWBs 400 covering the open ends of the microphone apertures 406. This screen material 409 can help to prevent dust and debris from getting into the microphone apertures 406. The screen material 409 can be applied as discrete segments at each of the microphone apertures, or may be laminated to the first gaskets 408; i.e., at open regions in the gaskets 408 that overlie the apertures 406). Suitable material for the screen 409 includes Saati Acoustex 145 available from Saati Company, Via Milano, Italy.

The acoustic interface member 404 defines a plurality of cavities 410 (one shown in FIG. 4C) each of which is arranged to align with a corresponding one of the microphones 402 when the loudspeaker 300 is fully assembled. Each of the cavities 410 extends from a top surface of the acoustic interface member 404 to a first open end of an aperture 412. Each of the apertures 412 (one shown in FIG. 4C) is formed in the acoustic interface member 404 and is arranged to align with a corresponding one of the apertures 406 in one of the PWBs 400 to provide an acoustic pathway between the corresponding one of the cavities 410 and an associated one of the microphones 402.

Each of the cavities 410 is tapered such that the cross-sectional area of the cavity 410 decreases from a maximum area at the top surface of the acoustic interface member 404 to a minimum area at the junction with the aperture 412.

A gasket material 414 is bonded to the acoustic interface member 404 and is configured such that it defines a discrete gasket 412 (a/k/a "second gasket") for each of the cavities 410. Each of the second gaskets 416 (one shown in FIG. 4C) is arranged to engage a bottom surface 420 of the top cap 308 of the housing 302 when the acoustic interface member 404 is fastened (e.g., via screws) to the top cap 308, thereby to form an acoustic seal between the acoustic interface member 404 and the top cap 308. In that regard, the second gaskets 416 can be compressed e.g., between 25% and 75%, e.g., 50%, following the coupling of the acoustic interface member 404 to the top cap 308 to form a good acoustic seal at each of the microphone locations.

In some cases, the acoustic interface member 404 is formed from a molded plastic (e.g., polycarbonate) part, and the gasket material 414 is bonded to the acoustic interface member 404 in a two-shot molding process in which a thermoplastic elastomer (TPE) is molded onto the polycarbonate part to form the plurality of second gaskets 416. In the implementation illustrated in FIG. 4A, there are four discrete regions of gasket material 414 (only three shown) that are molded onto the top surface 416 of the acoustic interface member 404, each of the regions defines two discrete gaskets 412.

The top cap 308 defines a plurality of apertures 418, which form an acoustically transparent grille for the microphones 402. In the illustrated example, the acoustic cavities 410 are arranged such that each one underlies three of the apertures 418 to allow the microphones 402 to pick up acoustic energy from a region external to the housing 302. At each of the microphone locations, an acoustic chamber 422 is defined by the sealed volume (i.e., as sealed by gaskets 408 & 416) from the bottom surface 420 of the top cap 308 down to the junction between the microphone 402 and the bottom surface of the PWB 400, including the acoustic cavity 410, the aperture 412, and the microphone aperture 406. And, at each of the microphone locations, the corresponding acoustic chamber 422, and the overlying apertures 418 collectively form a Helmholtz resonator in which air trapped in the apertures 418 behaves as an acoustic mass and air trapped in the chamber 420 acts as a compliance or spring.

Notably, the tapered shape of the cavity 410 has the effect of creating a relatively large surface area at the top surface of the acoustic interface member 404, large enough to cover the span of three of the apertures 418 in the top cap 308. This relatively large surface area can help to reduce the wind noise that is picked up by the microphone 402. At the same time, the tapering of the cavity 410 also enables the volume of the acoustic chamber 422 to be kept relatively small, which, as mentioned above, assists in pushing the resonance frequency of the Helmholtz resonator above the frequency band of interest (i.e., above the speech band). In that regard, the band of interest is about 200 Hz to about 8 kHz, and it can be desirable to push the resonant frequency of the Helmholtz resonator above 10 kHz.

The resonant frequency (f) of the Helmholtz resonator is determined by the following equation 1:

$$f = \frac{C}{2\pi}\sqrt{\frac{S}{v*L}} \quad \text{(eq. 1)}$$

where, c=the speed of sound in air (about 343 meters per second (m/s));

S=the effective cross-sectional area of the ports, which in the illustrated implementation is 3× the cross-sectional area of one port;

L=the effective length of the ports, which in the illustrated implementation is 3× the length of one port (or 3× the thickness of the top cap 308); and v=the volume of the acoustic chamber 422.

In the implementation illustrated in FIGS. 4A & 4C, the cavities 410 each have tapered shape that corresponds to a truncated rectangular pyramid. However, other tapered shapes, such as a truncated (circular) cone or a truncated elliptical cone, are also contemplated. In one example, the acoustic interface member 404 has a thickness of between about 1.80 mm (0.071 inches) and about 2.20 mm (0.087 inches); and the cavity 410 has a cross-sectional area acoustic interface member 404 of about 22.5 mm² (0.035 int) to about 25.7 mm² (0.040 in²) and extends at an angle of about 14 degrees to about 65 degrees to a depth of about 1.90 mm (0.075 inches) to about 2.20 mm (0.087 inches) where it interfaces with the corresponding aperture 412, which has a diameter of about 1.40 mm (0.055 inches) to about 1.50 mm (0.059 inches) and extends from the interface with the cavity 410 to the bottom surface of the PWB 400.

Figure 5:
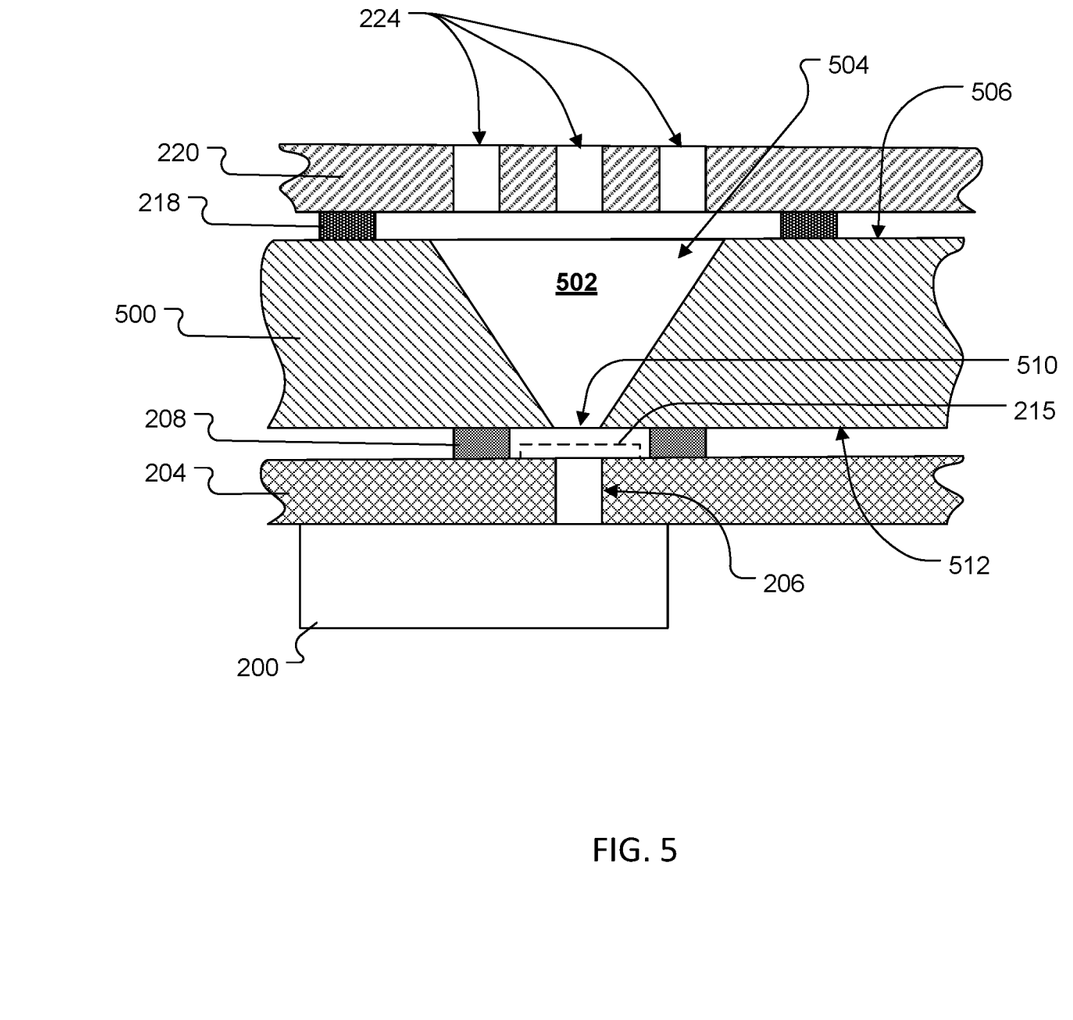
FIG. 5 is a cross-sectional view of a second implementation of a microphone mounting arrangement in accordance with this disclosure.

Furthermore, while implementations have been described in which the tapered walls of a cavity terminate at an open end of an aperture formed in an acoustic interface member, in other implementations the tapered walls may extend the entire distance from a top surface of the acoustic interface member to a bottom surface of the acoustic interface member. For example, FIG. 5 illustrates an embodiment in which the acoustic interface member 500 includes a cavity 502 with walls that taper from a first open end 504 located along a top surface 506 of the acoustic interface member 500 to a second open end 510 that is located along an opposite, bottom surface 512 of the acoustic interface member 500. The first open end 504 represents a maximum cross-sectional area of the cavity 502 and the second open end 510 represents a minimum cross-sectional area of the cavity 502. Certain reference numbers in FIG. 5 refer to correspondingly numbered elements in FIG. 2.

Figure 6:
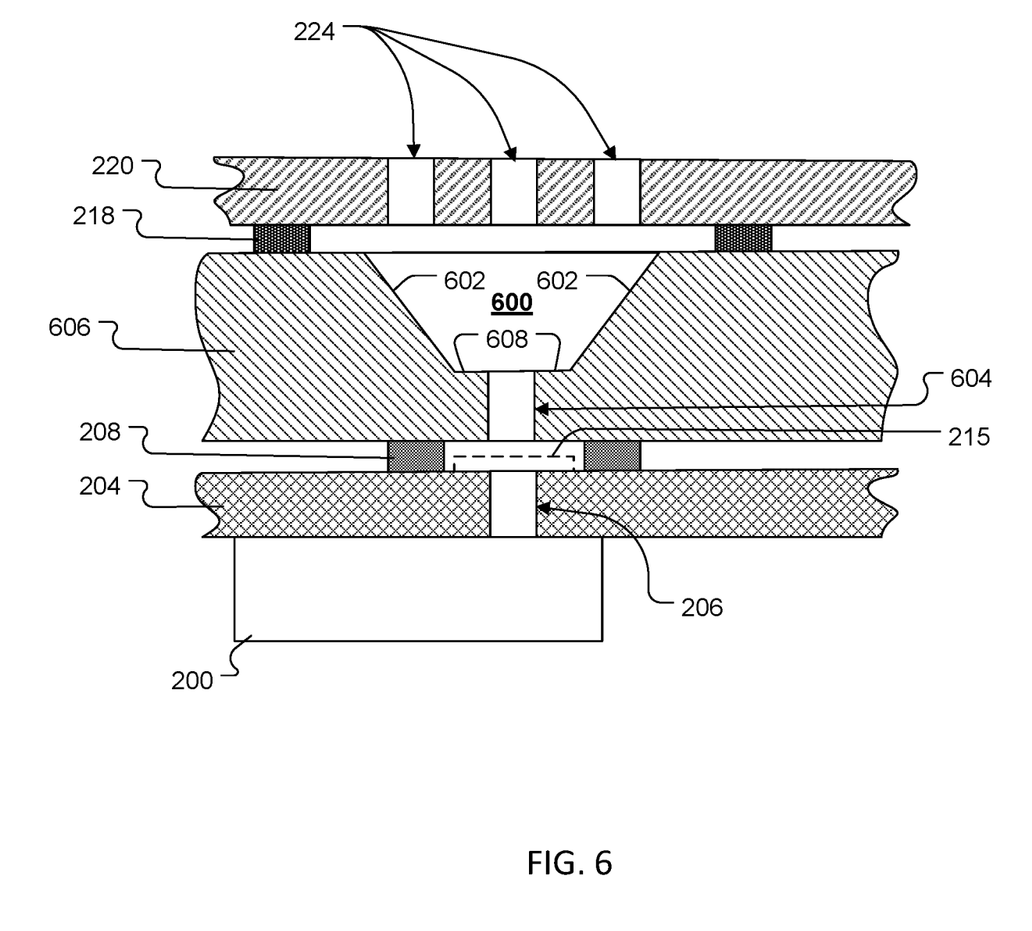
FIG. 6 is a cross-sectional view of a third implementation of a microphone mounting arrangement in accordance with this disclosure.

Alternatively, referring to FIG. 6, the cavity 600 may include tapered walls 602 that terminate along the plane of an open end of an aperture 604 formed in the acoustic interface member 606, and the terminal ends of the tapered walls 604 may be spaced away from the open end of the aperture 604 so as to form a plateau 608 between the terminal ends of the walls 602 and the open end of the aperture 604. Certain reference numbers in FIG. 6 refer to correspondingly numbered elements in FIG. 2.

A number of implementations have been described. Nevertheless, it will be understood that additional modifications may be made without departing from the scope of the inventive concepts described herein, and, accordingly, other implementations are within the scope of the following claims.

What is claimed is:

1. An apparatus comprising:
   a housing;
   a printed wiring board (PWB) within the housing, the PWB defining an aperture having a cross-sectional area;
   an acoustic interface member within the housing and defining a cavity that comprises one or more tapered walls which are arranged such that a maximum cross-sectional area of the cavity is at a first surface of the acoustic interface member that faces the housing, and a minimum cross-sectional area of the cavity is at a second surface of the acoustic interface member that is opposite the first surface and that faces the PWB; and a microphone within the housing and acoustically coupled to the cavity;

wherein the minimum cross-sectional area of the cavity is aligned with and equal to the cross-sectional area of the aperture of the PWB.

2. The apparatus of claim 1, wherein the maximum cross-sectional area of the cavity covers the span of three apertures in the housing.

3. The apparatus of claim 1, wherein the cavity comprises two or more tapered walls.

4. The apparatus of claim 1, wherein the entirety of the cavity is tapered.

5. The apparatus of claim 1, wherein the one or more tapered walls of the cavity create a tapered shape that corresponds to a truncated polygonal pyramid, a truncated circular cone, or a truncated elliptical cone.

6. The apparatus of claim 1, wherein the one or more tapered walls extend from the first surface of the acoustic interface member to the second surface of the acoustic interface member.

7. The apparatus of claim 1, wherein the one or more tapered walls extend from the first surface of the acoustic interface member to a flat wall of the cavity so as to form a plateau.

8. The apparatus of claim 1, wherein the housing defines one or more apertures which provide an acoustic path between a region external to the housing and the cavity.

9. The apparatus of claim 1, wherein an acoustic chamber is defined by a sealed volume that extends from a surface of the housing down to a junction between the microphone and the PWB.

10. The apparatus of claim 1, further comprising one or more electro-acoustic transducers within the housing and for transducing an electrical signal to acoustic energy.

11. A method of forming an apparatus, the method comprising:

providing a housing;

forming a printed wiring board (PWB) within the housing, the PWB defining an aperture having a cross-sectional area;

forming an acoustic interface member within the housing and defining a cavity that comprises one or more tapered walls which are arranged such that a maximum cross-sectional area of the cavity is at a first surface of the acoustic interface member that faces the housing, and a minimum cross-sectional area of the cavity is a second surface of the acoustic interface member that is opposite the first surface and faces the PWB; and forming a microphone within the housing and acoustically coupled to the cavity;

wherein the minimum cross-sectional area of the cavity is aligned with and equal to the cross-sectional area of the aperture of the PWB.

12. The method of claim 11, wherein the maximum cross-sectional area of the cavity covers the span of three apertures in the housing.

13. The method of claim 11, wherein the cavity comprises two or more tapered walls.

14. The method of claim 11, wherein the entirety of the cavity is tapered.

15. The method of claim 11, wherein the one or more tapered walls of the cavity create a tapered shape that corresponds to a truncated polygonal pyramid, a truncated circular cone, or a truncated elliptical cone.

16. The method of claim 11, wherein the one or more tapered walls extend from the first surface of the acoustic interface member to the second surface of the acoustic interface member.

17. The method of claim 11, wherein the one or more tapered walls extend from the first surface of the acoustic interface member to a flat wall of the cavity so as to form a plateau.

18. The method of claim 11, wherein the housing defines one or more apertures which provide an acoustic path between a region external to the housing and the cavity.

19. The method of claim 11, wherein an acoustic chamber is defined by a sealed volume that extends from a surface of the housing down to a junction between the microphone and the PWB.

20. The method of claim 11, further comprising forming one or more electro-acoustic transducers within the housing and for transducing an electrical signal to acoustic energy.

* * * * *